(12) United States Patent
Khlat et al.

(10) Patent No.: US 10,833,637 B2
(45) Date of Patent: Nov. 10, 2020

(54) CHARGE-PUMP TRACKER CIRCUITRY (71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 11 days.

(21) Appl. No.: 16/237,141

(22) Filed: Dec. 31, 2018

(65) Prior Publication Data
US 2019/0356285 A1 Nov. 21, 2019

Related U.S. Application Data (60) Provisional application No. 62/674,308, filed on May 21, 2018.

(51) Int. Cl.
*H03F 3/21* (2006.01)
*H02M 3/07* (2006.01)

(52) U.S. Cl.
CPC ............ *H03F 3/211* (2013.01); *H02M 3/07* (2013.01); *H03F 2200/102* (2013.01); *H03F 2200/105* (2013.01); *H03F 2200/451* (2013.01)

(58) Field of Classification Search
CPC ............ H03F 3/211; H03F 2200/105; H03F 2200/102; H03F 2200/451; H03F 1/02; H03F 3/68; H03F 3/245; H03F 3/195; H02M 3/07
USPC ............ 330/297, 127, 136, 51, 251, 207 A
See application file for complete search history.

(56) References Cited

U.S. PATENT DOCUMENTS

| 7,994,864 | B2* | 8/2011 | Chen | ............. H03F 1/0211 |
| | | | | 330/297 |
| 9,374,005 | B2* | 6/2016 | Rozek | ............. H02M 3/07 |
| 2012/0170334 | A1* | 7/2012 | Menegoli | ............. H02M 3/07 |
| | | | | 363/60 |

OTHER PUBLICATIONS

Notice of Allowance for U.S. Appl. No. 16/662,699, dated Aug. 31, 2020, 7 pages.

* cited by examiner

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

Charge-pump tracker circuitry is disclosed having a first switch network configured to couple a first capacitor between a voltage input terminal and a ground terminal during a first charging phase and couple the first capacitor between the voltage input terminal and a pump output terminal during a first discharging phase. A second switch network is configured to couple the second capacitor between the voltage input terminal and the ground terminal during a second charging phase and couple the second capacitor between the voltage input terminal and the pump output terminal during a second discharging phase. A switch controller is configured to control the first switch network and the second switch network so that the first discharging phase and the second discharging phase are in unison in a parallel mode and so that the first discharging phase and the second discharging phase alternate in an interleaved mode.

20 Claims, 5 Drawing Sheets

CHARGE-PUMP TRACKER CIRCUITRY

RELATED APPLICATIONS

This application claims the benefit of provisional patent application Ser. No. 62/674,308, filed May 21, 2018, the disclosure of which is hereby incorporated herein by reference in its entirety.

FIELD OF THE DISCLOSURE

The embodiments disclosed herein relate to power management systems for supplying power to radio frequency amplifiers.

BACKGROUND

Fifth-generation New Radio (5G-NR) wireless communication systems have been widely regarded as the next wireless communication standard beyond the current third-generation (3G) communication standard, such as wideband code division multiple access (WCDMA), and fourth-generation (4G) communication standard, such as Long-Term Evolution (LTE). The 5G-NR wireless communication system is expected to provide a significantly higher data rate, improved coverage range, enhanced signaling efficiency, and reduced latency compared with wireless communication systems based on the 3G and 4G communication standards.

In this regard, 5G-NR transmitting wireless devices need to power radio frequency amplifiers in an average power tracking mode when operating with a relatively large modulation bandwidth of 100 MHz or above within a power class 2 requirement. Alternatively, it is desirable for 5G-NR transmitting wireless devices to power radio frequency amplifiers in an envelope tracking mode for lower modulation bandwidths. As such, there is a need for charge-pump tracker circuitry that is reconfigurable to both deliver relatively higher voltages and currents demanded by the average power tracking and provide more efficient delivery of power in the envelope tracking mode.

SUMMARY

Charge-pump tracker circuitry is disclosed having a first switch network configured to couple a first capacitor between a voltage input terminal and a ground terminal during a first charging phase and couple the first capacitor between the voltage input terminal and a pump output terminal during a first discharging phase. A second switch network is configured to couple the second capacitor between the voltage input terminal and the ground terminal during a second charging phase and couple the second capacitor between the voltage input terminal and the pump output terminal during a second discharging phase. A switch controller is configured to control the first switch network and the second switch network so that the first discharging phase and the second discharging phase are in unison in a parallel mode and so that the first discharging phase and the second discharging phase alternate in an interleaved mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
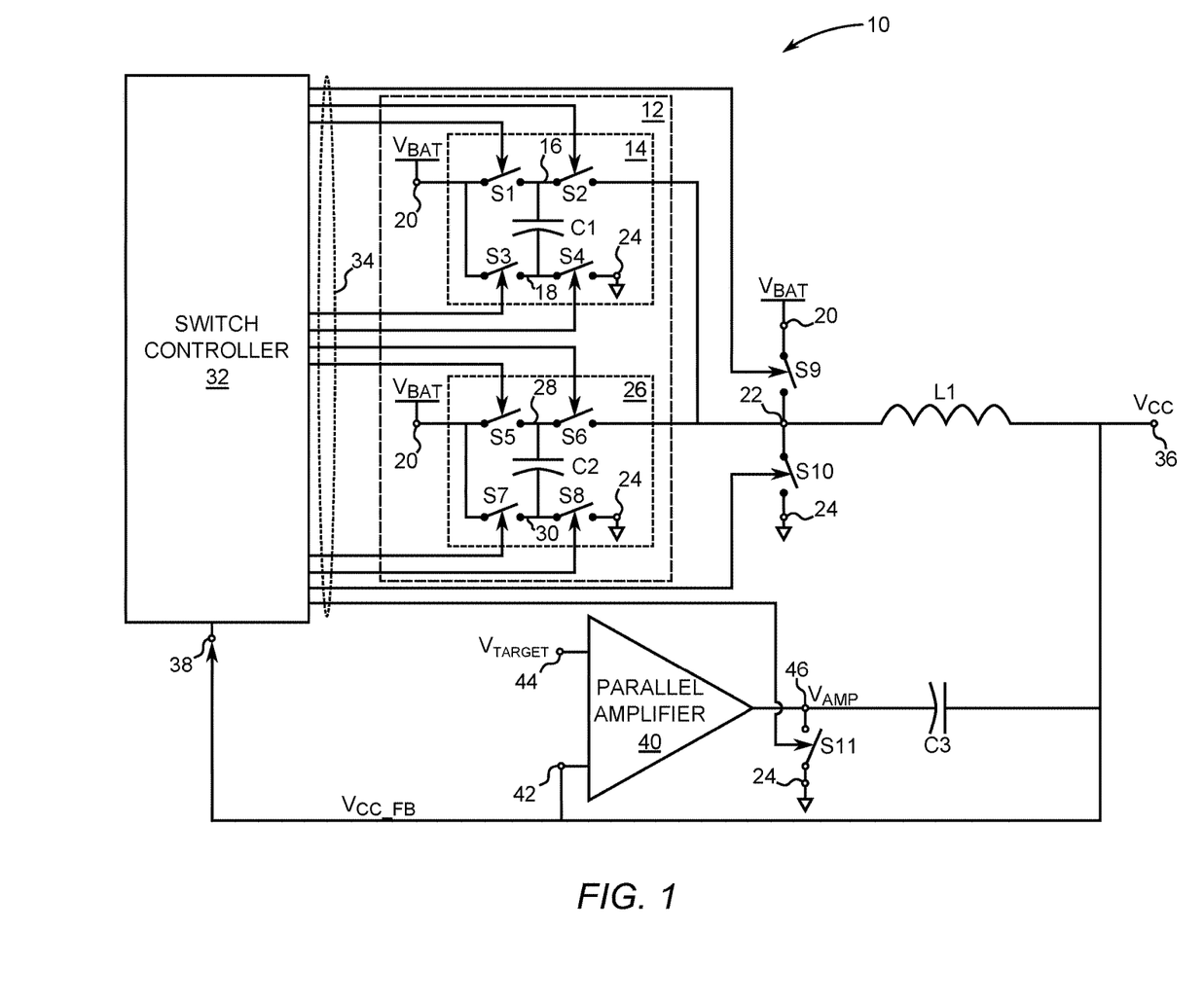
FIG. 1 is a schematic of charge-pump tracker circuitry that is reconfigurable in accordance with the present disclosure to provide an interleaved mode for average power tracking operation and a parallel mode for envelope tracking operation.

FIG. 1 is a schematic of an exemplary embodiment of charge-pump tracker circuitry 10 that is reconfigurable in accordance with the present disclosure to provide an interleaved mode for average power tracking (APT) operation and a parallel mode for envelope tracking (ET) operation. The charge-pump tracker circuitry 10 includes a dual-boost charge pump 12 having a first switch network 14 that includes a first capacitor C1 that is coupled between a first flying node 16 and a second flying node 18. A first switch S1 is coupled between a voltage source terminal 20 and the first flying node 16. A second switch S2 is coupled between a pump output terminal 22 and the first flying node 16. A third switch S3 is coupled between the second flying node 18 and the voltage source terminal 20, and a fourth switch S4 is coupled between a fixed voltage terminal 24 and the second flying node 18. A battery $V_{BAT}$ is typically coupled to the voltage source terminal 20, and the fixed voltage terminal 24 is typically coupled to ground.

The dual-boost charge pump 12 further includes a second switch network 26 that includes a first capacitor C2 that is coupled between a third flying node 28 and a fourth flying node 30. A fifth switch S5 is coupled between the voltage source terminal 20 and the third flying node 28. A sixth switch S6 is coupled between the pump output terminal 22 and the third flying node 28. A seventh switch S7 is coupled between the fourth flying node 30 and the voltage source terminal 20, and an eighth switch S8 is coupled between the fixed voltage terminal 24 and the fourth flying node 30.

The charge-pump tracker circuitry 10 further includes a switch controller 32 configured to control the opening and closing of the first through eighth switches S1-S8 of the first switch network 14 and the second switch network 26, respectively. In particular, the switch controller 32 has control bus 34 communicatively coupled to control terminals of the first through eighth switches S1-S8. In some embodiments, the first through eighth switches S1-S8 are field-effect transistors, wherein the control terminals are field-effect transistor gate terminals coupled to the control bus 34 of the switch controller 32. In other embodiments, the first through eighth switches S1-S8 are microelectromechanical system switches, wherein the control terminals are microelectromechanical system gate terminals coupled to the control bus 34.

In order to charge the first capacitor C1, the switch controller 32 initiates a first charging phase by commanding the first switch S1 and the fourth switch S4 to close and the third switch S3 and the fourth switch S4 to open so that a first charging current flows into the first capacitor C1. The switch controller 32 then commands the first switch S1 and the fourth switch S4 to open and the second switch S2 and the third switch S3 to close to initiate a first discharging phase to allow a first discharging current to flow from the first capacitor C1 and through the pump output terminal 22.

In order to charge the second capacitor C2, the switch controller 32 initiates a second charging phase by commanding the fifth switch S5 and the sixth switch S6 to close and the seventh switch S7 and the eighth switch S8 to open so that a second charging current flows into the second capacitor C2. The switch controller 32 then commands the fifth switch S5 and the eighth switch S8 to open and the sixth switch S6 and the seventh switch S7 to close to initiate a second discharging phase to allow a second discharging current to flow from the second capacitor C2 and through the pump output terminal 22.

The switch controller 32 is further configured to provide a parallel mode of operation by controlling the first switch network 14 made up of the first through fourth switches S1-S4 and the second switch network 26 made up of the fifth through eighth switches S5-S8 so that the first discharging phase and the second discharging phase are in unison. As such, the parallel mode provides a summation of the first discharging current and the second discharging current at the pump output terminal 22, which yields a higher efficiency for ET.

The switch controller 32 is yet further configured to provide an interleaved mode by controlling the first switch network 14 made up of the first through fourth switches S1-S4 and the second switch network 26 made up of the fifth through eighth S5-S8 such that the first discharging phase and the second discharging phase alternates so that the first discharging current and the second discharging currents do not sum at the pump output terminal 22 but instead flow through the pump output terminal 22 sequentially. As such, the interleave mode provides higher continuous power and is favored for APT.

The charge-pump tracker circuitry 10 further includes a power inductor L1 coupled between the pump output terminal 22 and an RF amplifier supply terminal 36 labeled $V_{CC}$. The power inductor L1 provides filtering of power generated by the dual-boost charge pump 12. In particular, the power inductor is configured to filter power flowing between the pump output terminal 22 and the RF amplifier supply terminal 36.

A ninth switch S9 is coupled between the voltage source terminal 20 and the pump output terminal 22, and a tenth switch S10 is coupled between the pump output terminal 22 and the fixed voltage terminal 24. In exemplary embodiments, the fixed voltage terminal 24 is coupled to ground. Control terminals of the ninth switch S9 and the tenth switch S10 are coupled to the control bus 34 of the switch controller 32, which in some embodiments is configured to momentarily selectively close the ninth switch S9 and the tenth switch S10 in an alternating sequence to maintain current flow through the power inductor L1 when the second switch S2 and the sixth switch S6 are open.

A feedback input terminal 38 is coupled to the RF amplifier supply terminal 36 to convey a feedback signal $V_{CC\_FB}$ to the switch controller 32, which in some embodiments is further configured to automatically switch between the parallel mode and the interleaved mode based upon a predetermined feedback signal set point.

The charge-pump tracker circuitry 10 further includes a parallel amplifier 40 that has a first amplifier input terminal 42 coupled to the RF amplifier supply terminal 36 to receive the feedback signal $V_{CC\_FB}$. The parallel amplifier 40 further includes a target voltage input terminal 44 for receiving a target voltage waveform $V_{TARGET}$, and an amplifier output terminal 46 through which an amplified voltage waveform $V_{AMP}$ that is a scaled difference between the feedback signal $V_{CC\_FB}$ and the target voltage waveform $V_{TARGET}$ is provided. The amplifier output terminal 46 is coupled to the RF amplifier supply terminal 36 through a third capacitor C3 that provides an offset voltage to increase dynamic range of the amplified voltage waveform $V_{AMP}$ in order to reduce the maximum voltage needed to supply the parallel amplifier 40, and thereby further increase efficiency.

An eleventh switch S11 is coupled between the amplifier output terminal 46 and the fixed voltage terminal 24, which in this exemplary embodiment is coupled to ground. A control terminal of the eleventh switch S11 is coupled to the control bus 34. The switch controller 32 is configured to close the eleventh switch S11 when the parallel amplifier 40 is disabled and open the eleventh switch S11 when the parallel amplifier 40 is enabled. The parallel amplifier 40 typically is enabled during a higher power demand operation such as APT and disabled during a lower power demand operation such as ET.

Figure 2:
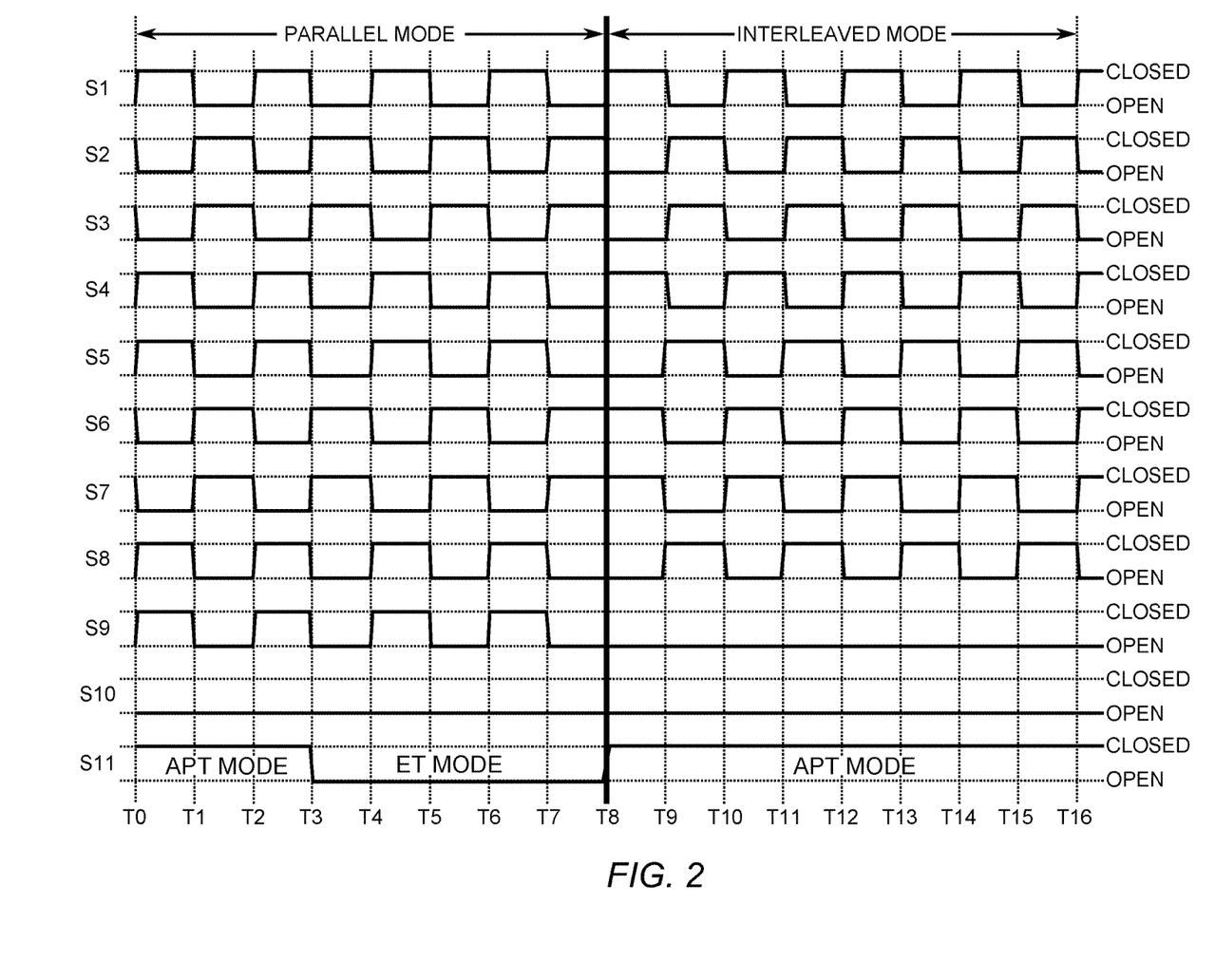
FIG. 2 is an exemplary timing diagram for open and closed states of switches of the charge-pump tracker circuitry operated in both the parallel mode and the interleaved mode.

FIG. 2 is an exemplary timing diagram for open and closed states of the first through eighth switches S1-S8 in both the parallel mode and the interleaved mode. While the exemplary timing diagram depicts a 50% duty cycle in the parallel mode and a 100% duty cycle in the interleaved mode, other embodiments can be operated that have different duty cycles. Time periods T0 through T8 depict open and closed states of the first through eighth switches S1-S8 needed for the parallel mode, while time periods T8 through T16 depict open and closed states of the first through eighth switches S1-S8 needed for the interleaved mode. Referring to both the schematic of the exemplary embodiment of charge-pump tracker circuitry 10 in FIG. 1 and the timing diagram of FIG. 2, notice that the switch controller 32 closes both the second switch S2 and the sixth switch S6 in unison while operating in the parallel mode. In contrast, notice that the switch controller 32 opens the second switch S2 while closing the sixth switch S6 and closes the second switch S2 while opening the sixth switch S6 in the interleaved mode. In the parallel mode, the ninth switch S9 matches the openings and closures of the first switch S1, the fourth switch S4, the fifth switch S5, and the eighth switch S8. Moreover, in parallel mode, the tenth switch S10 is open while boosting the voltage source $V_{BAT}$. In some embodiments, while bucking the voltage source $V_{BAT}$, the tenth switch is closed. Further still, in the parallel mode, the eleventh switch S11 is closed for APT operation and open during ET operation.

In the interleaved mode, the ninth switch S9 remains open during 100% duty cycle operation as depicted in the exemplary timing diagram of FIG. 2. However, in other embodiments operating at other than 100% duty cycle, the ninth switch S9 is open when either the second switch S2 or the sixth switch S6 is closed. The tenth switch S10 is open while boosting the voltage source $V_{BAT}$. In some embodiments, while bucking the voltage source $V_{BAT}$, the tenth switch is closed. The eleventh switch S11 is closed during APT operation in the interleaved mode. However, ET operation is typically not used in interleaved mode. Therefore, the eleventh switch S11 is not open in the interleaved mode.

The dual-boost charge pump 12 of FIG. 1 is considered to be in a high-impedance state, also referred to as a HiZ state, when all of the switches, the first switch S1 through the eighth switch S8 are simultaneously open. In some embodiments, while bucking the voltage source $V_{BAT}$, the ninth switch S9 and the tenth switch S10 are alternately opened and closed to toggle coupling of the pump output terminal 22 between the voltage source $V_{BAT}$ and ground. Moreover, during a boosting operation while operating in the parallel mode, the pump output node alternates between a voltage equal to $V_{BAT}$ and twice $V_{BAT}$. Further still, during a boosting operation and while operating in the interleaved mode, voltage at the pump output node terminal 22 alternates between a voltage equal to $V_{BAT}$ and twice $V_{BAT}$ during a first phase and a second phase. Note, that when boosting in the interleaved mode at 100% duty cycle, the pump output node terminal 22 is not toggled to $V_{BAT}$. Instead, the first phase and the second phase in the interleaved mode at 100% duty cycle spend time at twice $V_{BAT}$ voltage but never at $V_{BAT}$ voltage.

Figure 3:
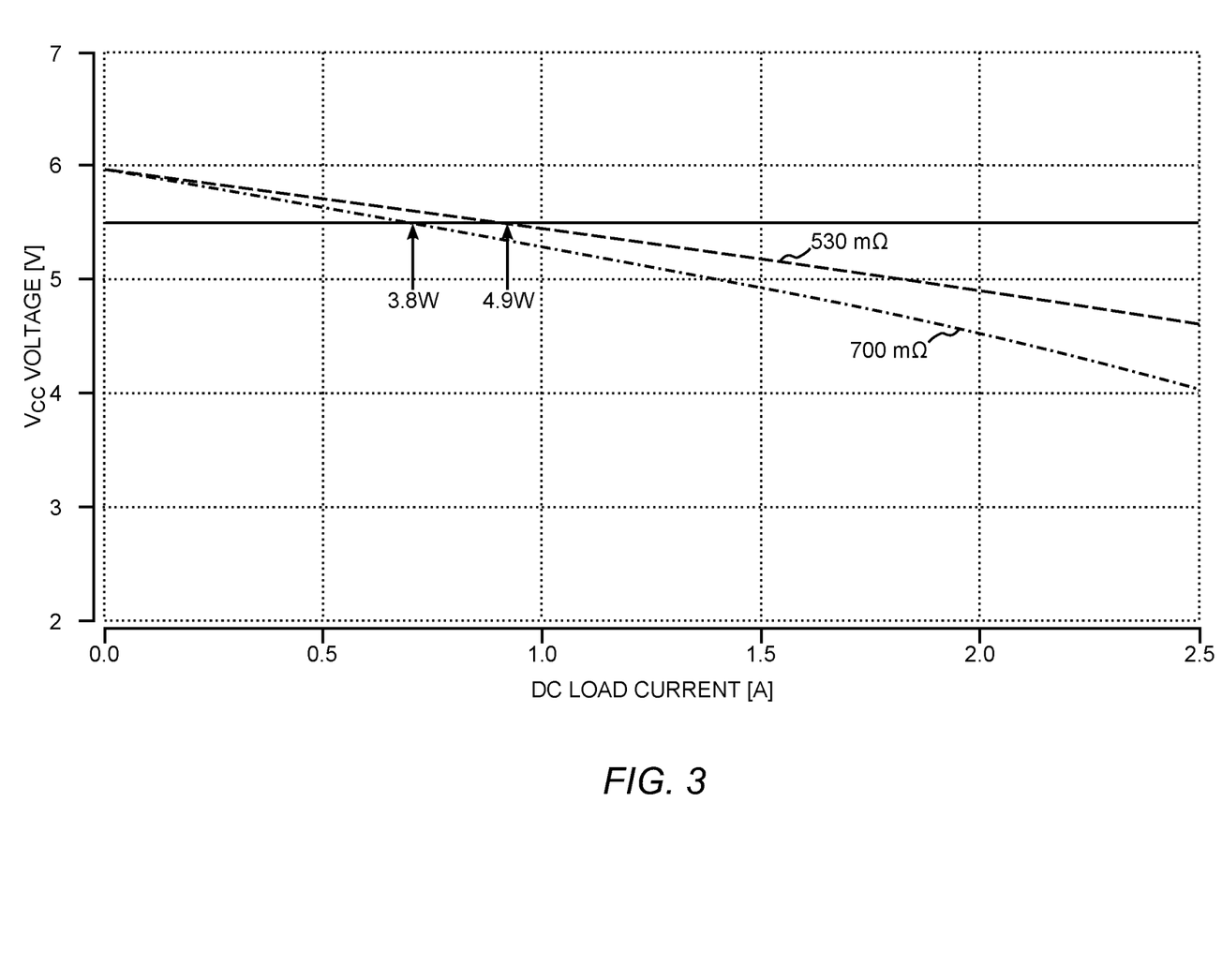
FIG. 3 is a graph of supply voltage $V_{CC}$ versus direct current (DC) load current for a related-art single-boost charge pump operating at a duty cycle of 75%.

FIG. 3 is a graph of supply voltage $V_{CC}$ versus direct current (DC) load current for a related-art single-boost charge pump operating at a duty cycle of 75%. The dashed line represents a typical load slope, while the dot-dash line represents a worst case load slope. In particular, the graph of FIG. 3 depicts related-art type performance of a circuit structure similar to the circuit structure of the embodiment of FIG. 1, assuming that the capacitor C1 is doubled in size, the first switch network 14 is operated at a 75% duty cycle, and that the second switch network 26 does not exist. The graph shows that a maximum of 5.5 V can be generated for a 3.4 V voltage source for a maximum DC load current of 0.7 A. Thus, the related-art single-boost charge pump delivers 3.8 W of power for a load of 700 mΩ and 4.9 W of power for a load of 530 mΩ while operating at a 75% duty cycle.

Figure 4:
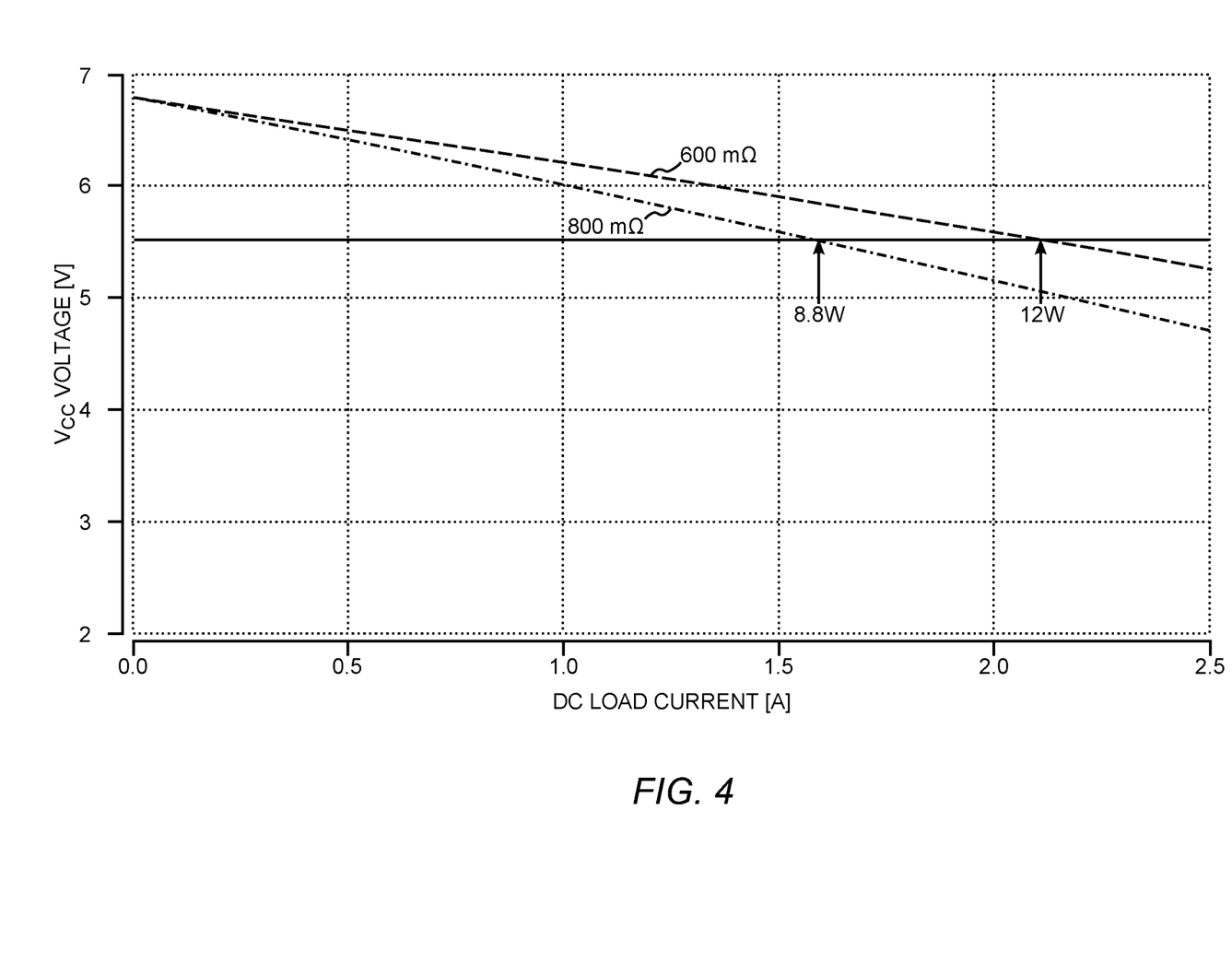
FIG. 4 is a graph of supply voltage $V_{CC}$ versus DC load current for the embodiment of FIG. 1 operated in the interleaved mode at a duty cycle of 100%.

In comparison, FIG. 4 is a graph of supply voltage $V_{CC}$ versus DC load current for the embodiment of FIG. 1 operated in the interleaved mode. As in FIG. 3, the dashed line represents a typical load slope, while the dot-dash line represents a worst case load slope. The graph shows that a maximum of 5.5 V can be generated for a 3.4 V voltage source for a maximum DC load current of 1.6 A. Thus, the dual-boost charge pump 12 of FIG. 1 delivers 8.8 W of power for a load of 800 mΩ and 12 W of power for a load of 600 mΩ while operating at a 100% duty cycle.

Figure 5:
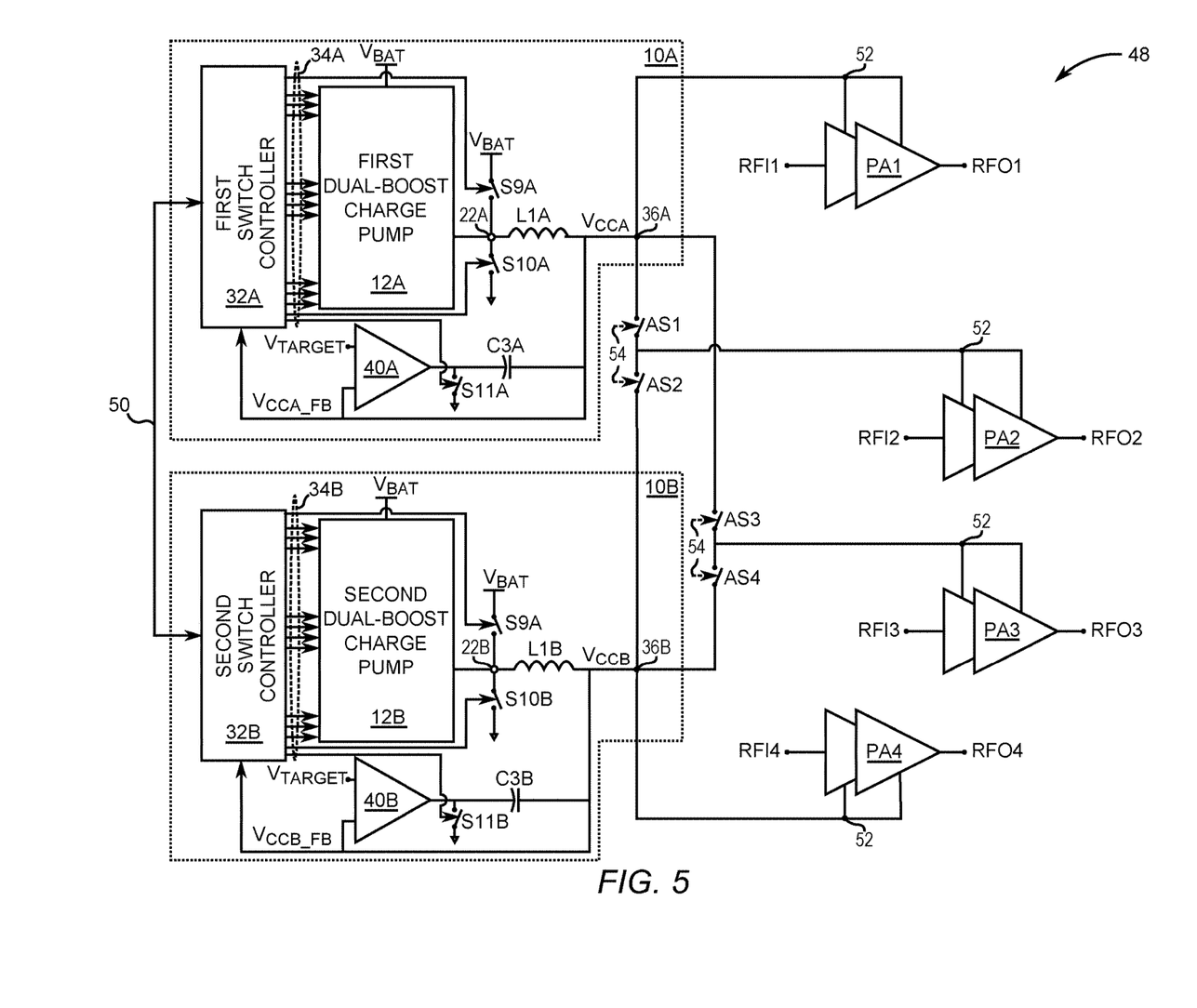
FIG. 5 is a schematic of a twin charge-pump tracker system with dual-boost charge pumps and controller that is configured to operate the dual-boost charge pumps in the interleaved mode for average power tracking operation and the parallel mode for envelope tracking operation.

FIG. 5 is a schematic of an exemplary embodiment of a charge-pump tracker system 48 having first charge-pump tracker circuitry 10A including a first dual-boost charge pump 12A and second charge-pump tracker circuitry 10B including a second dual-boost charge pump 12B. A first switch controller 32A controls the first dual-boost charge pump 12A over a first control bus 34A, and a second switch controller 32B controls the second dual-boost charge pump 12B over a second control bus 34B. Both the first switch controller 32A and the second switch controller 32B, respectively, are configured to operate the first dual-boost charge pump 12A and the second dual-boost charge pump 12B in the interleaved mode for APT operation and in the parallel mode for ET operation. Moreover, in at least some embodiments, the first switch controller 32A and the second switch controller 32B are configured to communicate over a communication link 50 to share data and operating mode status.

The first dual-boost charge pump 12A and the second dual-boost charge pump 12B are identical in structure to the dual-boost charge pump 12 included in the charge-pump tracker circuitry 10 (FIG. 1).

Moreover, the first charge-pump tracker circuitry 10A further includes a first parallel amplifier 40A that receives feedback signal $V_{CCA\_FB}$. The first parallel amplifier 40A receives the target voltage waveform $V_{TARGET}$. A third capacitor C3A provides an offset voltage to an amplified difference between the feedback signal $V_{CCA\_FB}$ and the target voltage waveform $V_{TARGET}$.

A first eleventh switch S11A is coupled between an output of the first parallel amplifier 40A and ground. A control terminal of the first eleventh switch S11A is coupled to the first control bus 34A. The first switch controller 32A is configured to close the first eleventh switch S11A when the first parallel amplifier 40A is disabled and open the first eleventh switch S11A when the first parallel amplifier 40A is enabled. The first parallel amplifier 40A typically is enabled during a higher power demand operation such as APT and disabled during a lower power demand operation such as ET.

The first charge-pump tracker circuitry 10A further includes a first power inductor L1A coupled between a first pump output terminal 22A and a first RF amplifier supply terminal 36A labeled $V_{CCA}$. The first power inductor L1A provides filtering of voltage generated by the first dual-boost charge pump 12A. A first ninth switch S9A is coupled between the voltage source $V_{BAT}$ and the first pump output terminal 22A, and a first tenth switch S10A is coupled between the first pump output terminal 22A and ground. Control terminals of the first ninth switch S9A and the first tenth switch S10A are coupled to the first control bus 34A of the first switch controller 32A, which in some embodiments is configured to momentarily selectively close the first ninth switch S9A and the first tenth switch S10A in an alternating sequence to maintain current flow through the first power inductor L1A when no current from the first dual-boost charge pump 12A is flowing to the first pump output terminal 22A.

Further still, the second charge-pump tracker circuitry 10B further includes a second parallel amplifier 40B that receives feedback signal $V_{CCB\_FB}$. The second parallel amplifier 40B receives the target voltage waveform $V_{TARGET}$. A third capacitor C3B provides an offset voltage to an amplified difference between the feedback signal $V_{CCB\_FB}$ and the target voltage waveform $V_{TARGET}$.

A second eleventh switch S11B is coupled between an output of the second parallel amplifier 40B and ground. A control terminal of the second eleventh switch S11B is coupled to a second control bus 34B. The second switch controller 32B is configured to close the second eleventh switch S11B when the second parallel amplifier 40B is disabled and open the second eleventh switch S11B when the second parallel amplifier 40B is enabled. The second parallel amplifier 40B typically is enabled during a higher power demand operation such as APT and disabled during a lower power demand operation such as ET.

The second charge-pump tracker circuitry 10B further includes a second power inductor L1B coupled between a second pump output terminal 22B and a second RF amplifier supply terminal 36B labeled $V_{CCB}$. The second power inductor L1B provides filtering of voltage generated by the second dual-boost charge pump 12B. A second ninth switch S9B is coupled between the voltage source $V_{BAT}$ and the second pump output terminal 22B, and a second tenth switch S10B is coupled between the second pump output terminal 22B and ground. Control terminals of the second ninth switch S9B and the second tenth switch S10B are coupled to the second control bus 34B of the second switch controller 32B, which in some embodiments is configured to momentarily selectively close the second ninth switch S9B and the second tenth switch S10B in an alternating sequence to maintain current flow through the second power inductor L1B when no current from the second dual-boost charge pump 12B is flowing to the second pump output terminal 22B.

As depicted in FIG. 5, the exemplary embodiment of the charge-pump tracker system 48 includes a plurality of RF power amplifiers PA1, PA2, PA3, and PA4 having a first RF input RFI1, a first RF output RFO1, a second RF input RFI2, a second RF output RFO2, a third RF input RFI3, a third RF output RFO3, a fourth RF input RFI4, and a fourth RF output RFO4, respectively. Power from the first charge-pump tracker circuitry 10A and the second charge pump tracker circuitry 10B may be routed through a plurality of auxiliary switches AS1, AS2, AS3, and AS4 either individually or in combination to supply the plurality of power amplifiers PA1, PA2, PA3, and PA4. For example, each of the plurality of auxiliary switches AS1, AS2, AS3, and AS4 is configured to selectively couple supply input terminals 52 of at least some of the plurality of RF amplifiers PA1, PA2, PA3, and PA4 to the first RF amplifier supply terminal 36A and the second RF amplifier supply terminal 36B. Auxiliary control terminals 54 for the plurality of auxiliary switches AS1, AS2, AS3, and AS4 may be coupled to control outputs of a baseband controller (not shown).

Those skilled in the art will recognize improvements and modifications to the preferred embodiments of the present disclosure. All such improvements and modifications are considered within the scope of the concepts disclosed herein and the claims that follow.

What is claimed is:

1. Charge-pump tracker circuitry comprising:
    a first capacitor;
    a first switch network configured to couple the first capacitor between a voltage input terminal and a ground terminal during a first charging phase and couple the first capacitor between the voltage input terminal and a pump output terminal during a first discharging phase;
    a second capacitor;
    a second switch network configured to couple the second capacitor between the voltage input terminal and the ground terminal during a second charging phase and couple the second capacitor between the voltage input terminal and the pump output terminal during a second discharging phase; and
    a switch controller configured to control the first switch network and the second switch network so that the first discharging phase and the second discharging phase are in unison in a parallel mode and so that the first discharging phase and the second discharging phase alternate in an interleaved mode, and wherein the switch controller is further configured to receive a feedback signal of output voltage and automatically switch between the parallel mode and the interleaved mode based upon the feedback signal passing through a predetermined feedback set point.

2. The charge-pump tracker circuitry of claim 1 wherein the first capacitor is coupled between a first flying node and a second flying node, and the first switch network comprises:

a first switch coupled between the first flying node and a voltage source terminal through which a first charging current flows into the first capacitor when the first switch is closed;

a second switch coupled between the first flying node and a first output terminal that receives a first discharging current from the first capacitor when the second switch is closed;

a third switch coupled between the second flying node and the voltage source terminal through which a voltage at the voltage source terminal is supplied to the second flying node when the third switch is closed; and a fourth switch coupled between the second flying node and a first ground node terminal that grounds the second flying node when the fourth switch is closed.

3. The charge-pump tracker circuitry of claim 2 wherein the second capacitor is coupled between a third flying node and a fourth flying node, and the second switch network comprises:

a fifth switch coupled between the third flying node and the voltage source terminal through which a second charging current flows into the second capacitor when the fifth switch is closed;

a sixth switch coupled between the third flying node and the first output terminal that receives a second discharging current from the second capacitor when the sixth switch is closed;

a seventh switch coupled between the fourth flying node and the voltage source terminal through which the voltage at the voltage source terminal is supplied to the fourth flying node when the seventh switch is closed; and an eighth switch coupled between the fourth flying node and a second ground node terminal that grounds the fourth flying node when the eighth switch is closed.

4. The charge-pump tracker circuitry of claim 3 wherein the switch controller is configured to open and close the second switch and the sixth switch in unison in the parallel mode and simultaneously open the second switch and close the sixth switch and vice versa in the interleaved mode.

5. The charge-pump tracker circuitry of claim 1 wherein the first discharging phase and the second discharging phase provide a 100% duty cycle for the interleaved mode.

6. The charge-pump tracker circuitry of claim 1 further including a power inductor coupled between the pump output terminal and a radio frequency (RF) amplifier supply terminal, wherein the power inductor is configured to filter power flowing between the pump output terminal and the RF amplifier supply terminal.

7. The charge-pump tracker circuitry of claim 6 further including a parallel amplifier having:

a first amplifier input terminal coupled to the RF amplifier supply terminal to receive the feedback signal;

a second amplifier input terminal configured to receive a target voltage waveform; and an amplifier output terminal communicatively coupled to the pump output terminal, wherein the parallel amplifier is configured to provide an amplified output waveform in response to a difference between the target voltage waveform and the feedback signal.

8. The charge-pump tracker circuitry of claim 7 wherein the target voltage waveform is an envelope tracking signal.

9. The charge-pump tracker circuitry of claim 7 wherein the target voltage waveform is an average power tracking signal.

10. The charge-pump tracker circuitry of claim 7 further including an offset capacitor coupled between the amplifier output terminal and the RF amplifier supply terminal, wherein the offset capacitor is configured to provide an offset voltage to increase dynamic range of the amplified output waveform in order to reduce a maximum voltage needed to supply the parallel amplifier.

11. A charge-pump tracker system comprising:

a first dual-boost charge pump configured to selectively provide a first discharging current from a first capacitor and a second discharging current from a second capacitor through a first RF amplifier supply terminal;

a first switch controller configured to control the first dual-boost charge pump so that the first discharging current and the second discharging current flow simultaneously through the first RF amplifier supply terminal in a first parallel mode and so that the first discharging current and the second discharging current alternate through the first RF amplifier supply terminal in a first interleaved mode, and wherein the first switch controller is further configured to receive a first feedback signal of a first output voltage and automatically switch between the first parallel mode and the first interleaved mode based upon the first feedback signal passing through a first predetermined feedback set point;

a second dual-boost charge pump configured to selectively provide a third discharge current from a third capacitor and a fourth discharge current from a fourth capacitor through a second RF amplifier supply terminal; and a second switch controller configured to control the second dual-boost charge pump so that the third discharge current and the fourth discharge current flow simultaneously through the second RF amplifier supply terminal in a second parallel mode and so that the third discharge current and the fourth discharge current alternate through the second RF amplifier supply terminal in a second interleaved mode, and wherein the second switch controller is further configured to receive a second feedback signal of a second output voltage and automatically switch between the second parallel mode and the second interleaved mode based upon the second feedback signal passing through a second predetermined feedback set point.

12. The charge-pump tracker system of claim 11 further including a plurality of RF amplifiers that are configured to receive power from the first RF amplifier supply terminal and the second RF amplifier supply terminal.

13. The charge-pump tracker system of claim 12 further including auxiliary switches configured to selectively couple supply input terminals of at least some of the plurality of RF amplifiers to the first RF amplifier supply terminal and the second RF amplifier supply terminal.

14. The charge-pump tracker system of claim 13 wherein the first switch controller and the second switch controller are configured to simultaneously provide power to some of the plurality of RF amplifiers by way of the first parallel mode and/or the second parallel mode and supply others of the plurality of RF amplifiers by way of the first interleaved mode and/or the second interleaved mode.

15. The charge-pump tracker system of claim 11 further comprising:

a first parallel amplifier having:

a first amplifier input terminal coupled to the first RF amplifier supply terminal to receive the first feedback signal;

a second amplifier input terminal configured to receive a target voltage waveform; and a first amplifier output terminal communicatively coupled to a first pump output terminal, wherein the first parallel amplifier is configured to provide a first amplified output waveform in response to a difference between the target voltage waveform and the first feedback signal; and a second parallel amplifier having:

a second amplifier input terminal coupled to the second RF amplifier supply terminal to receive the second feedback signal;

a third amplifier input terminal configured to receive a target voltage waveform; and a fourth amplifier output terminal communicatively coupled to a second pump output terminal, wherein the second parallel amplifier is configured to provide a second amplified output waveform in response to a difference between the target voltage waveform and the second feedback signal.

16. The charge-pump tracker system of claim 15 wherein the target voltage waveform is an envelope tracking signal.

17. The charge-pump tracker system of claim 15 wherein the target voltage waveform is an average power tracking signal.

18. The charge-pump tracker system of claim 11 wherein the first discharging current and the second discharging current are provided by a first discharging phase and a second discharging phase that together provide a 100% duty cycle for the first interleaved mode.

19. The charge-pump tracker system of claim 11 further including a first power inductor coupled between the first pump output terminal and the first RF amplifier supply terminal, wherein the first power inductor is configured to filter power flowing between the first pump output terminal and the first RF amplifier supply terminal.

20. The charge-pump tracker system of claim 15 further including a second power inductor coupled between the second pump output terminal and the second RF amplifier supply terminal, wherein the second power inductor is configured to filter power flowing between the second pump output terminal and the second RF amplifier supply terminal.

* * * * *